(12) United States Patent
Chuang et al.

(10) Patent No.: US 6,770,532 B2
(45) Date of Patent: Aug. 3, 2004

(54) METHOD FOR FABRICATING MEMORY UNIT WITH T-SHAPED GATE

(75) Inventors: Ying-Cheng Chuang, Taoyuan Hsien (TW); Chung-Lin Huang, Taichung (TW); Chi-Hui Lin, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/435,447

(22) Filed: May 9, 2003

(65) Prior Publication Data

US 2004/0033657 A1 Feb. 19, 2004

(30) Foreign Application Priority Data

Aug. 15, 2002 (TW) ........................................ 91118387 A

(51) Int. Cl.[7] ............................................. H01L 21/336
(52) U.S. Cl. ....................... 438/257; 438/230; 438/304; 438/585
(58) Field of Search ............................... 438/585, 304, 438/257, 230

(56) References Cited

U.S. PATENT DOCUMENTS 5,434,093 A * 7/1995 Chau et al. ................. 438/300
5,714,412 A * 2/1998 Liang et al. ................. 438/266
6,093,945 A * 7/2000 Yang .......................... 257/317
6,344,995 B2 * 2/2002 Chen et al. ............. 365/185.18

FOREIGN PATENT DOCUMENTS

JP          10289957 A * 10/1998  ....... H01L/21/8247

* cited by examiner

Primary Examiner—Amir Zarabian
Assistant Examiner—Jeff Vockrodt
(74) Attorney, Agent, or Firm—Quintero Law Office

(57) ABSTRACT

A method for fabricating a memory unit with T-shaped gate. A semiconductor substrate forming a dielectric layer, a first opening, and a second opening is provided in a CMOS process. A silicate glass spacer is formed on the sidewall of the first opening and is thermally oxidized to form a light doped area under the silicate glass spacer. The silicate glass spacer is removed. An insulating spacer is formed on the sidewall of the first opening. A first spacer is formed on a sidewall of the second opening. N-type conducting spacers are formed respectively on sidewalls of the insulating spacer and the first spacer. Gate dielectric layers are formed respectively in the first opening and the second opening. A P-type conducting layer fills with the first opening and the second opening, and a second spacer is formed on a sidewall of a conducting spacer of the second opening.

24 Claims, 21 Drawing Sheets

US 6,770,532 B2

METHOD FOR FABRICATING MEMORY UNIT WITH T-SHAPED GATE

BACKGROUND OF THE INVENTION

1. Field of the Invention

The invention relates to a method for fabricating a gate, and more particularly to a method for fabricating a T-shaped gate.

2. Description of the Related Art

The size of memory units is reduced and integration is increased at the semiconductor fabricating process. In the fabricating process of a gate, a pattern of the gate is developed a mask to a photoresist layer, and then transferred to a hard mask layer. A conducting layer is etched to form a gate using the patterned hard mask layer as a mask. The pattern of the gate in the photoresist layer is narrower when the width of the gate is smaller. Furthermore, the resolution is better when the thickness of the photoresist layer is thinner, but the etch resistance is reduced.

FIGS. 1a to 1c are cross-sections of the conventional method for forming a gate.

In FIG. 1a, a semiconductor substrate 101 is provided, and a gate dielectric layer 102, a conducting layer 103, a hard mask layer 104, and a patterned photoresist layer 105 are sequentially formed thereon.

In FIG. 1b, the hard mask layer 104, the conducting layer 103, and the dielectric layer 102 are sequentially etched to form a gate 103a and a gate dielectric layer 102a using the patterned photoresist layer 105 as a mask.

In FIG. 1c, the patterned photoresist layer 105 and the hard mask layer 104 are removed.

The width of the gate 103a is d1, wherein the width of the gate 103a is the same as the pattern of the patterned photoresist layer 105.

The size of the gate is limited to lithography technology and the characteristic of the photoresist layer; therefore it is difficult to reduce the width of the gate to 0.05 um.

SUMMARY OF THE INVENTION

The present invention is directed to a method for fabricating a T-shaped gate. The width of the gate is reduced and controlled, and the integration of the memory unit is increased, moreover, salicide is easily formed and sheet resistance is reduced.

Accordingly, the present invention provides a method for fabricating a memory unit with a T-shaped gate for a NMOS. A semiconductor substrate is provided, with a dielectric layer and a patterned hard mask having an opening are sequentially formed thereon, wherein the dielectric layer is exposed through the opening. A doped spacer is formed on a sidewall of the opening. The doped spacer is annealed to form a lightly doped area in the semiconductor substrate. The doped spacer and the dielectric layer in the opening are removed. An insulating spacer is formed on the sidewall of the opening. A gate dielectric layer is formed on the exposed semiconductor substrate in the opening, and a conducting layer is filled in the opening. The patterned hard mask layer is removed. An ion doped area is formed on a side of the lightly doped area in the semiconductor substrate.

Accordingly, the present invention provides a method for fabricating a memory unit with a T-shaped gate for a PMOS. A semiconductor substrate is provided, with a dielectric layer and a patterned hard mask layer having an opening sequentially formed thereon, wherein the dielectric layer is exposed through the opening. An N type conducting spacer is formed on a sidewall of the opening. The semiconductor substrate is thermally oxidized to form a gate dielectric layer on the semiconductor substrate and the N type conducting spacer. The opening is filled with a P type conducting layer. The patterned hard mask layer is removed. An insulating layer is formed on a sidewall of the N type conducting spacer.

Accordingly, the present invention also provides a method for fabricating a memory unit with a T-shaped gate for a CMOS. A semiconductor substrate is provided with a dielectric layer and a patterned hard mask layer having a first opening and a second opening formed thereon. The dielectric layer is exposed through the first opening and the second opening. A silicate glass spacer is formed on a sidewall of the first opening. The exposed dielectric layer in the first opening and the second opening are sequentially removed. The silicate glass spacer is annealed to form a lightly doped area under the silicate doped area. The silicate glass spacer is removed. An insulating spacer is formed on a sidewall of the first opening. A first spacer is formed on a sidewall of the second opening. A first N type conducting spacer and a second N type conducting spacer are formed on a sidewall of the insulating spacer and the second opening respectively. A first gate dielectric layer is formed on the exposed semiconductor substrate in the first opening and the first N type conducting spacer. A second gate dielectric layer is formed on the semiconductor substrate in the second opening and the second N type conducting spacer. The first opening and the second opening are filled with a first P type conducting layer and a second P type conducting layer respectively. The patterned hard mask layer is removed. A second spacer is formed on the sidewall of the second N type conducting spacer.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2l are cross sections of the method for forming a memory unit with a T-shaped gate of Embodiment 1 of the present invention.

FIGS. 3a to 3j are cross section of the method for forming a memory unit with a T-shaped gate of Embodiment 2 of the present invention.

Figure 4A:
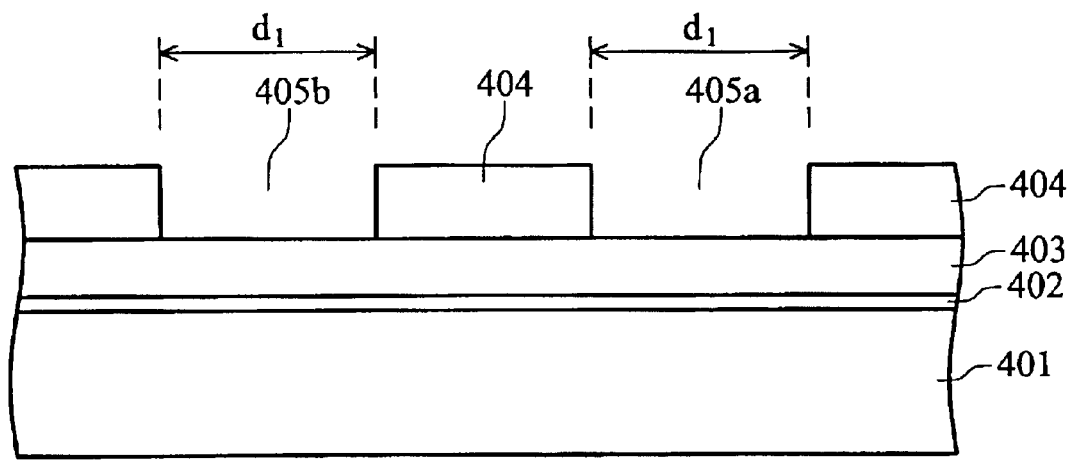
FIGS. 4a to 4p are cross sections of the method for forming a memory unit with a T-shaped gate of Embodiment 3 of the present invention.
Figure 4B:
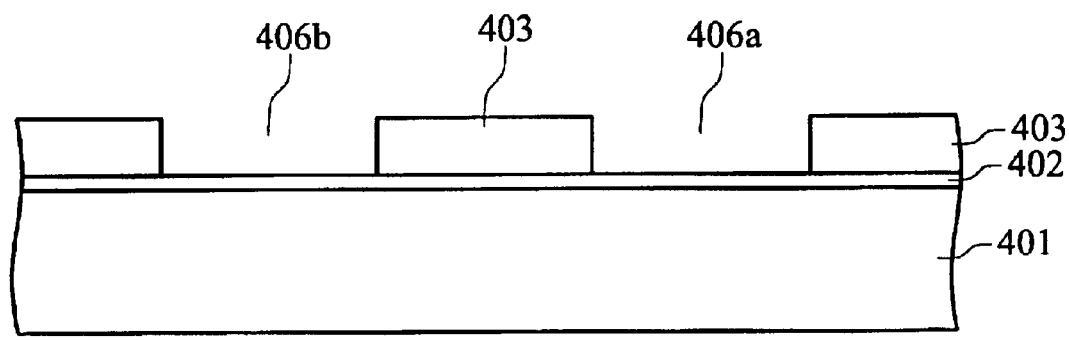
Figure 4C:
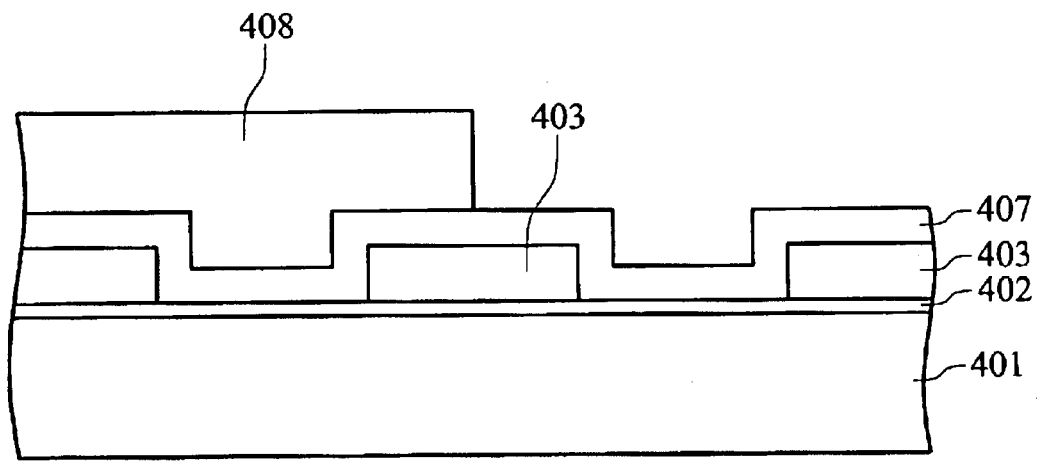
Figure 4D:
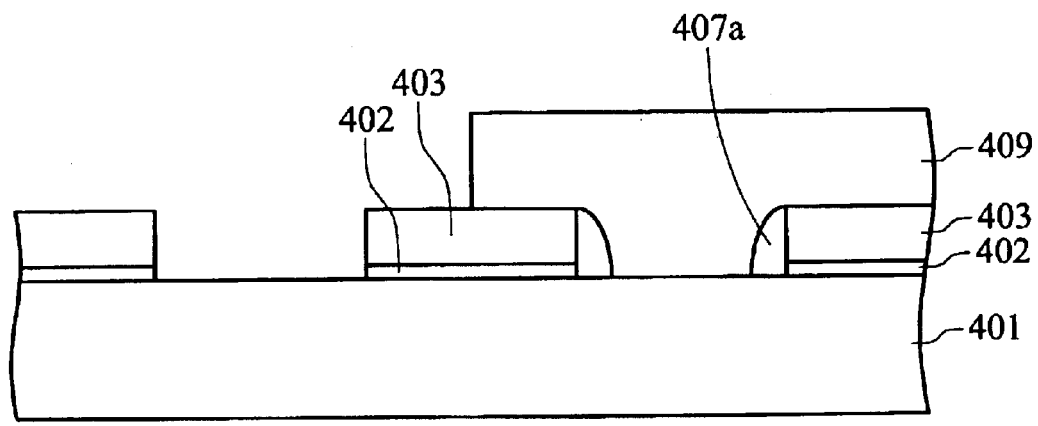
Figure 4E:
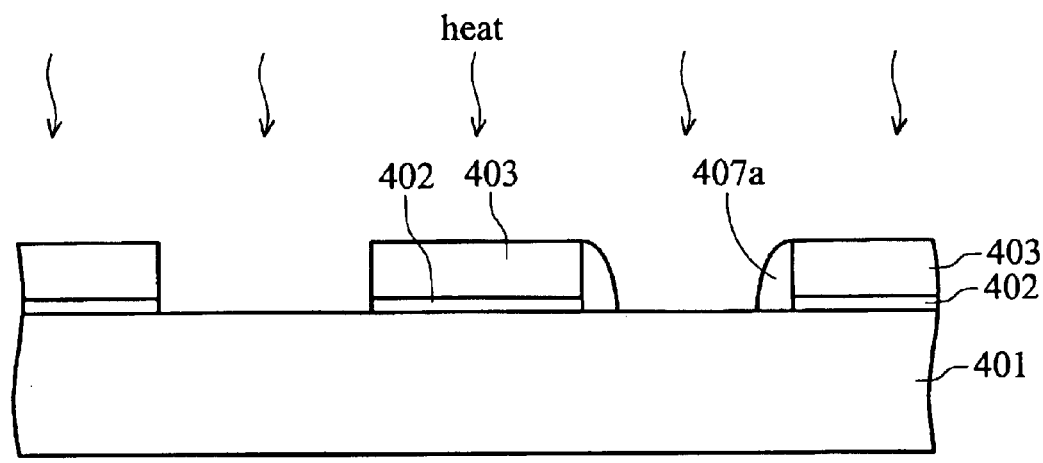
Figure 4F:
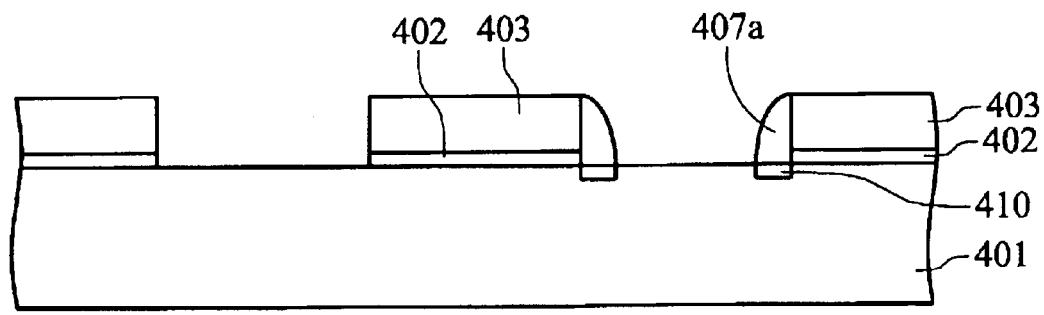
Figure 4G:
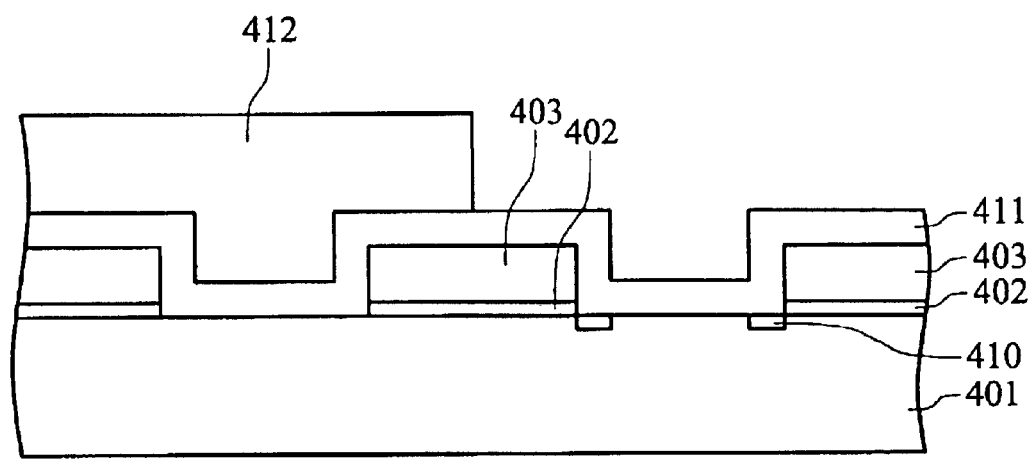
Figure 4H:
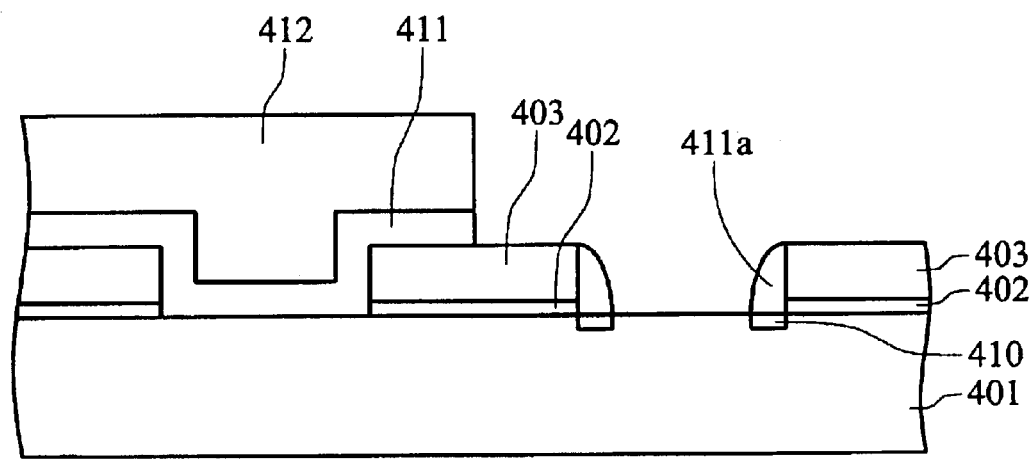
Figure 4I:
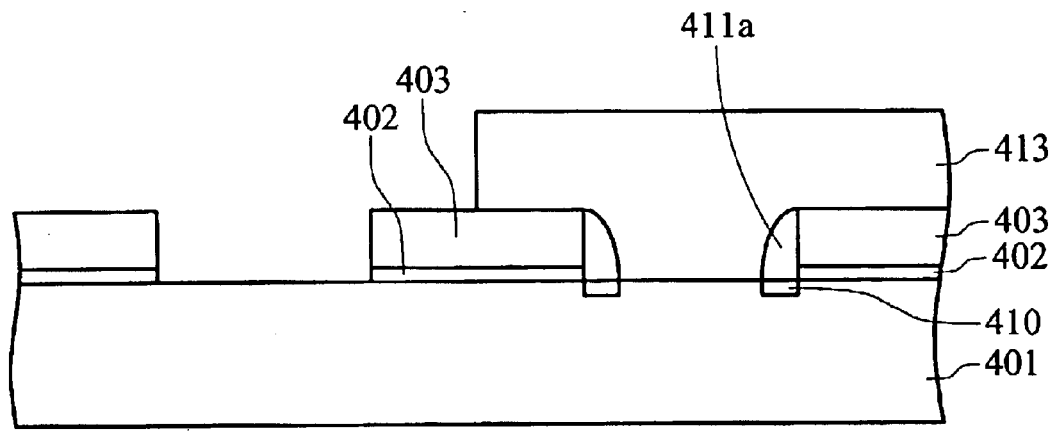
Figure 4J:
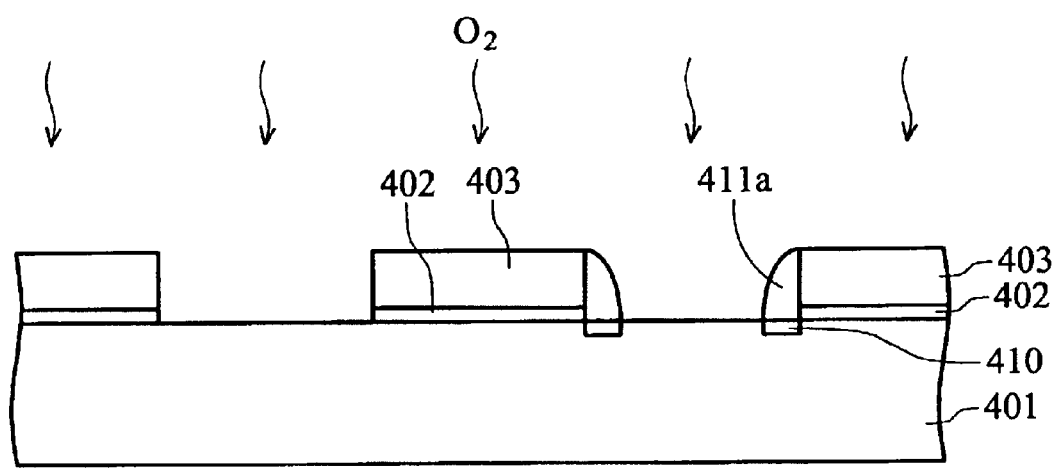
Figure 4K:
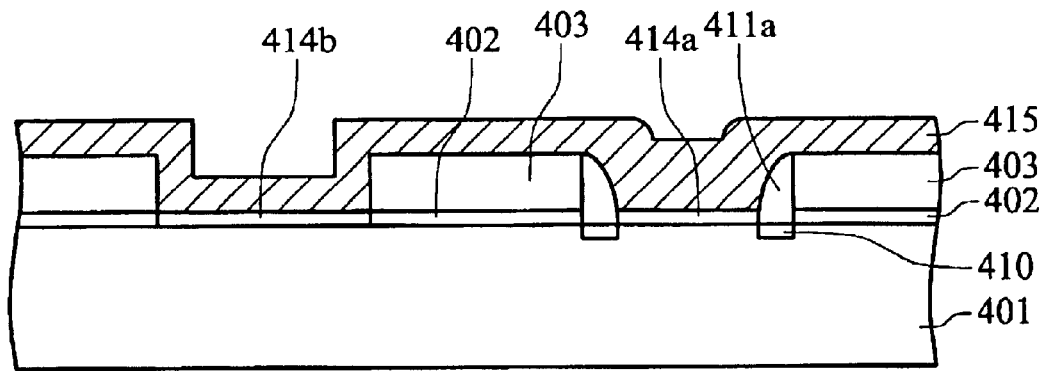
Figure 4L:
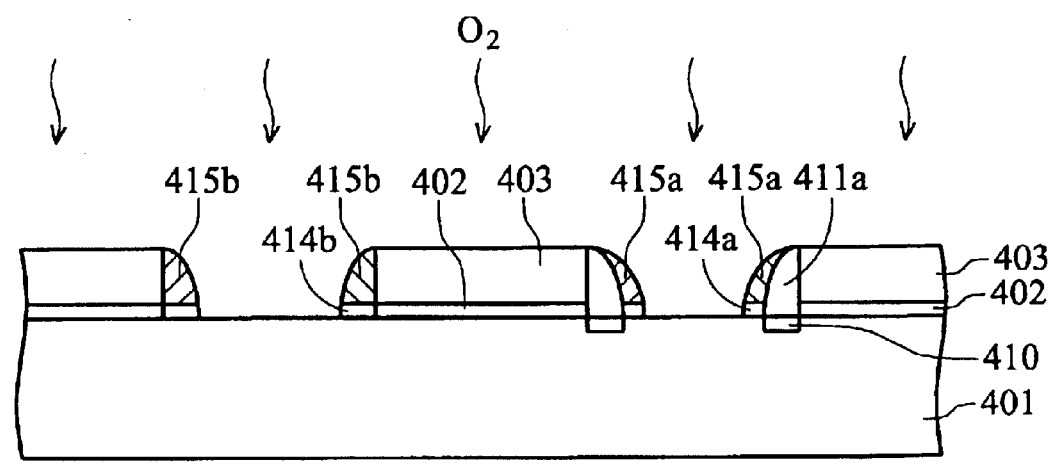
Figure 4M:
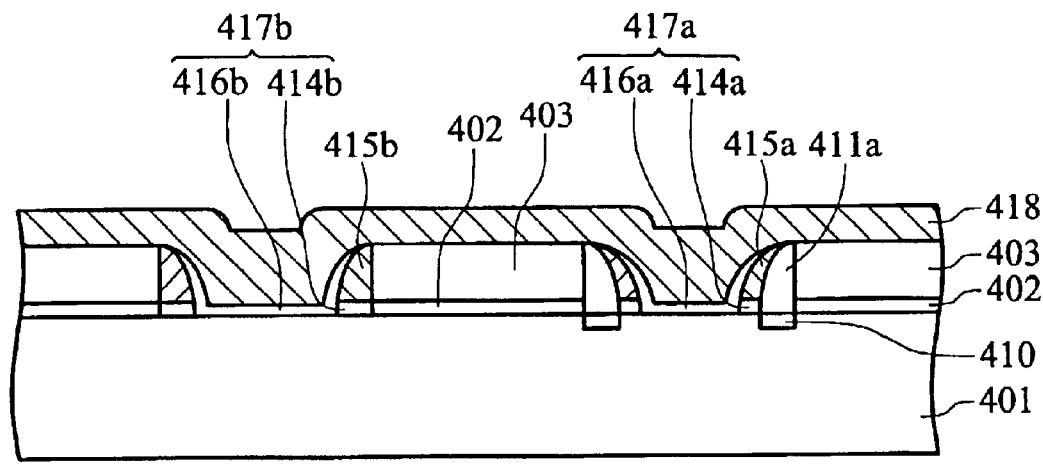
Figure 4N:
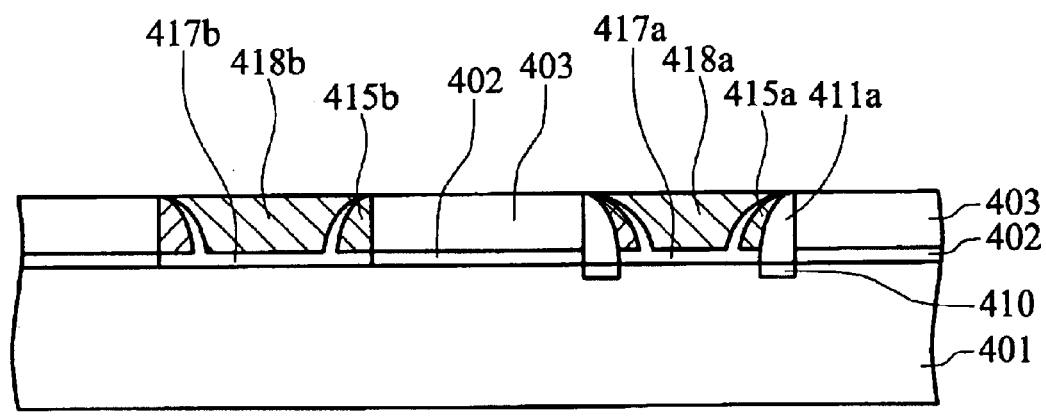
Figure 4O:
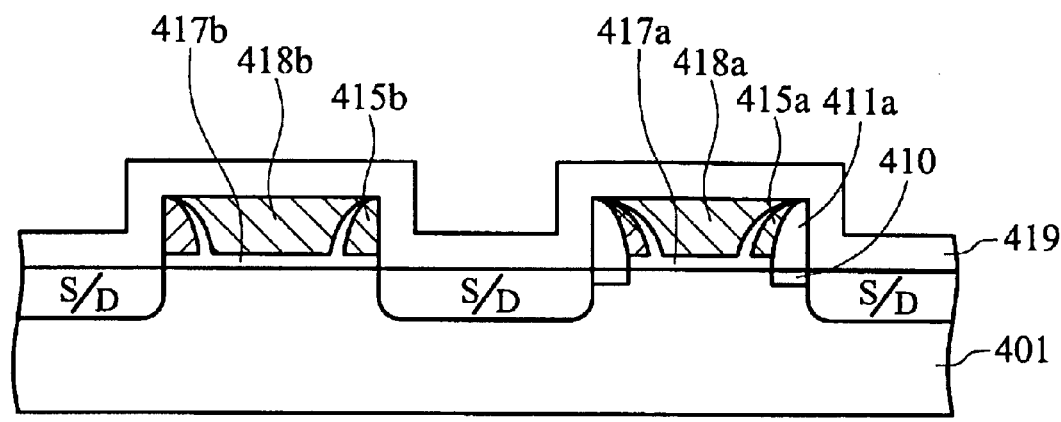
Figure 4P:
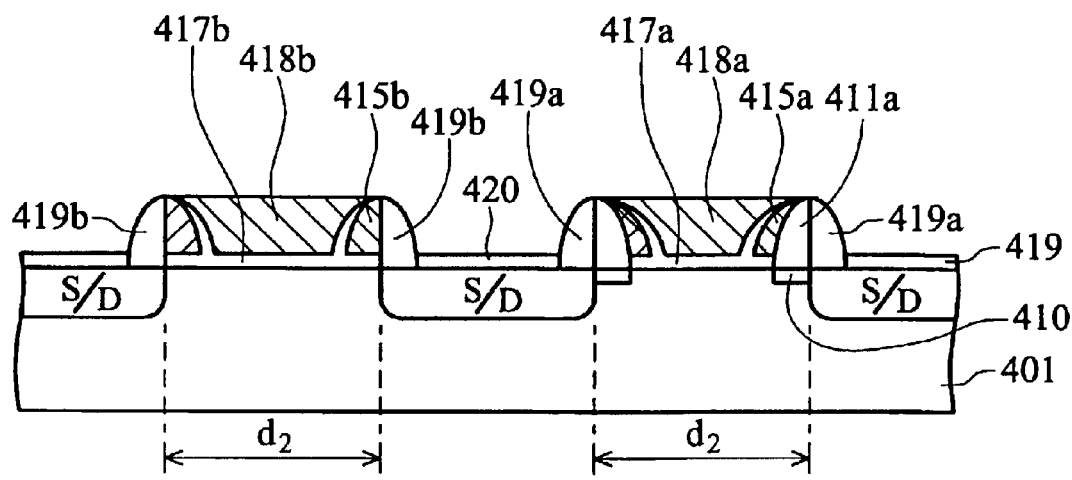

FIGS. 4a to 4p are cross sections of the method for forming a memory unit with a T-shaped gate of Embodiment 3 of the present invention.

Embodiment 1

Figure 1A:
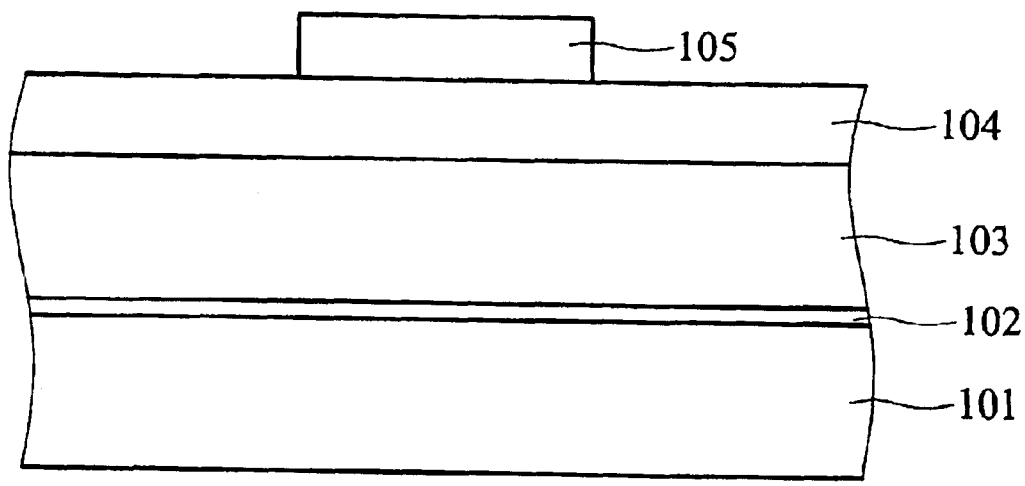
FIGS. 1a to 1c are cross-sections of the conventional method for forming a gate.
Figure 1B:
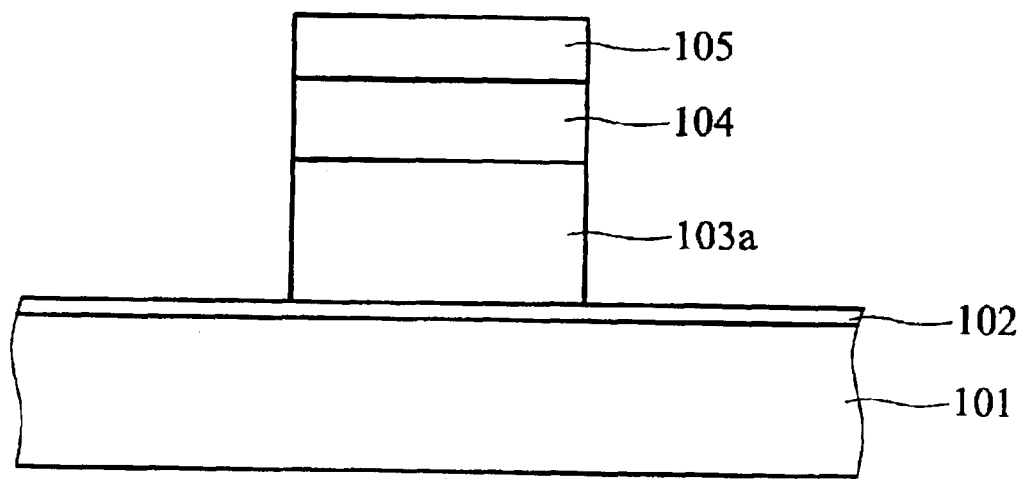
Figure 1C:
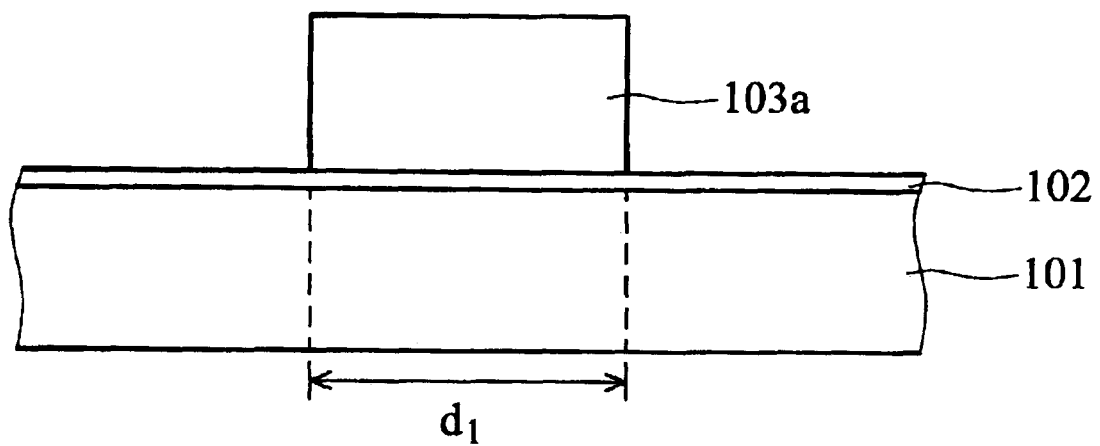
Figure 2A:
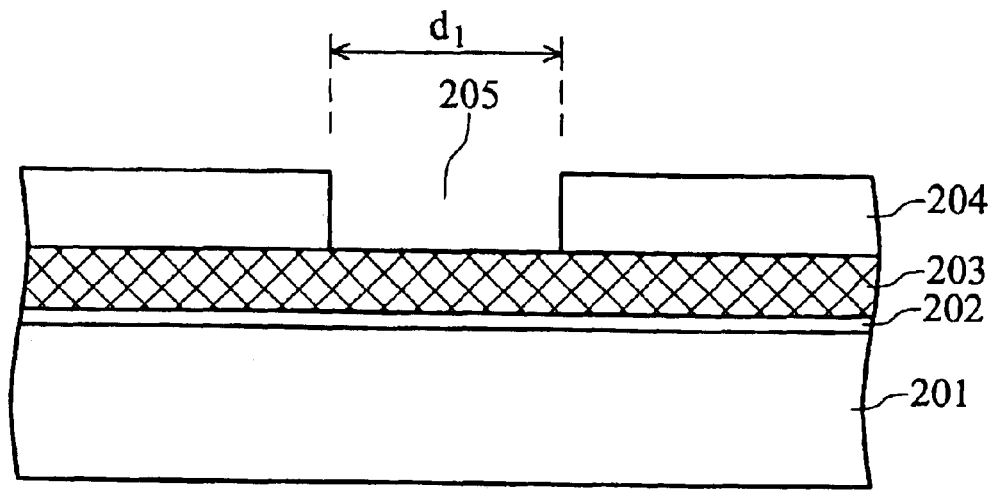
FIGS. 2a to 2l are cross sections of the method for forming a memory unit with a T-shaped gate of Embodiment 1 of the present invention.

In FIG. 2a, a semiconductor substrate 201, such as Si substrate, is provided. A dielectric layer 202, such as a pad oxide layer, a hard mask layer 203, such as a LPCVD nitride layer, and a patterned resist layer 204 with an opening 205 are sequentially formed over the semiconductor substrate 201, with the opening 205 exposing the surface of the hard mask layer 203.

Figure 2B:
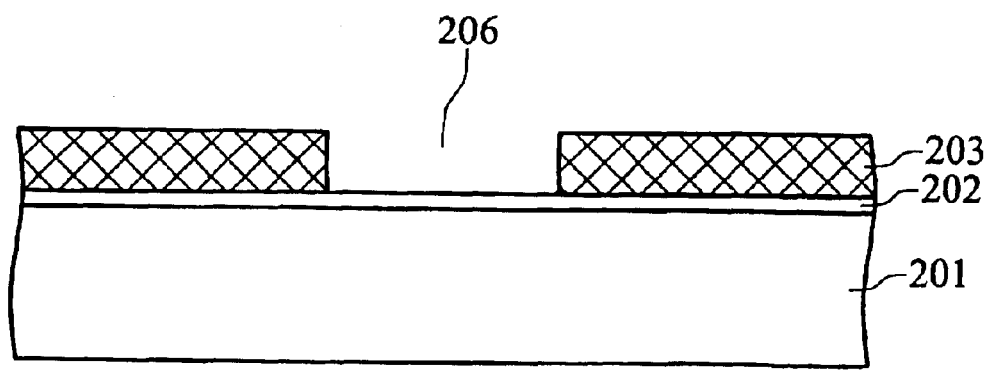

In FIG. 2b, the hard mask layer 203 is etched to form an opening 206 using the patterned resist layer 204 as a mask. The opening 206 in the hard mask layer 203 exposes the surface of the dielectric layer 202.

Figure 2C:
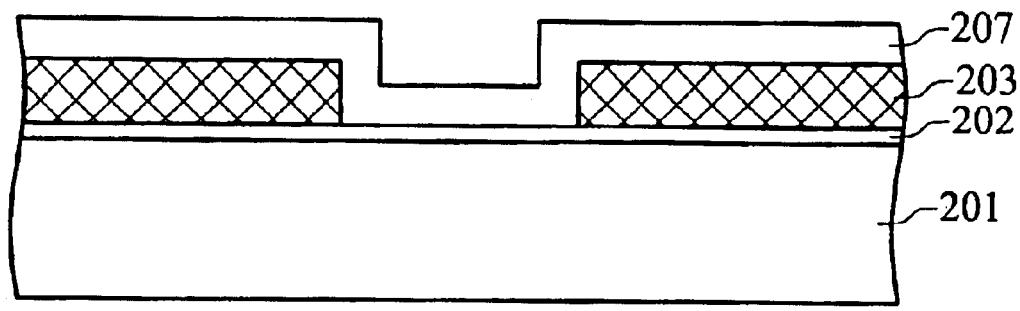

In FIG. 2c, a first insulating layer 207 is conformally formed over the hard mask layer 203 and the opening 206. The forming method of the first insulating layer 207 can be chemical vapor deposition. The first insulating layer 207 can be a silicate glass layer such as borosilicate glass layer.

Figure 2D:
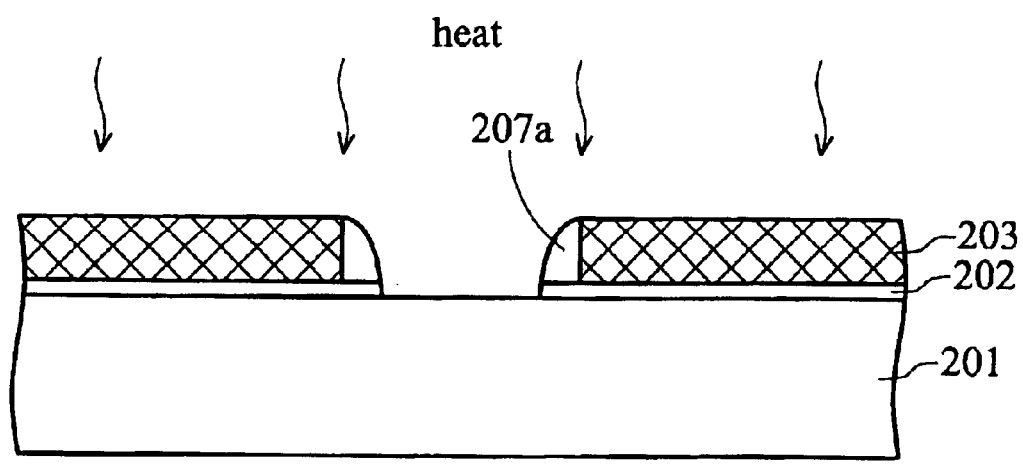

In FIG. 2d, the first insulating layer 207 is anisotropic etched to form a first spacer 207a on a sidewall of the opening 206, and the exposed dielectric layer 202 exposed through the opening 206 is removed. The anisotropic etching comprises reactive ion etching and plasma etching.

Figure 2E:
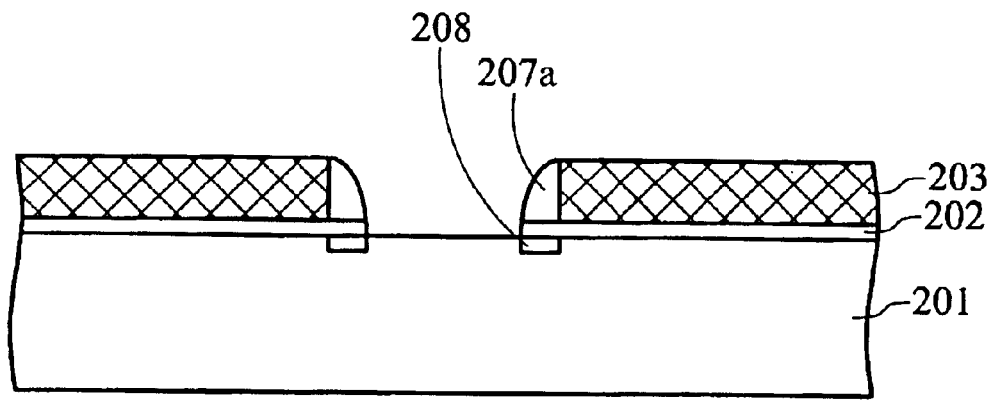

In FIG. 2e, the first spacer 207a is annealed to form a lightly doped area 208 under the first spacer 207a in the semiconductor substrate 201 by the boron ions diffusing to the semiconductor substrate 201, and the first spacer 207a is removed. The lightly doped area 208 can be a P type lightly doped area such as a boron lightly doped area.

Figure 2F:
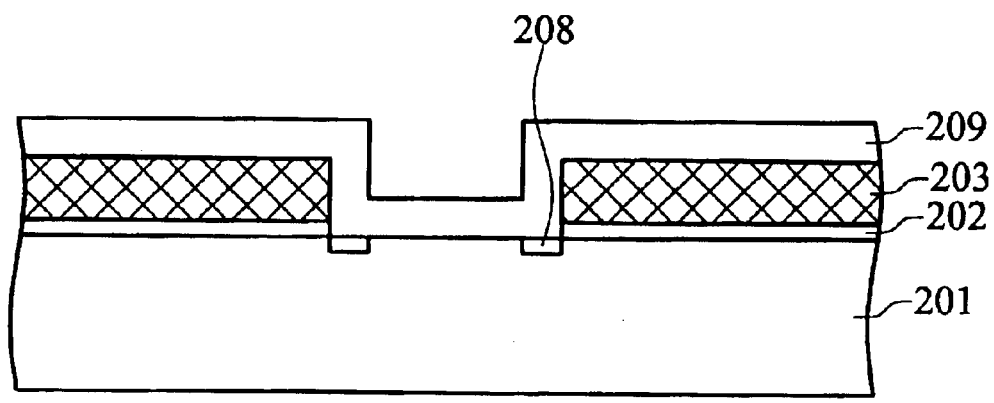

In FIG. 2f, a second insulating layer 209, such as a LPCVD oxide layer or a PECVD oxide layer, is conformally formed over the hard mask layer 203 and the opening 206.

Figure 2G:
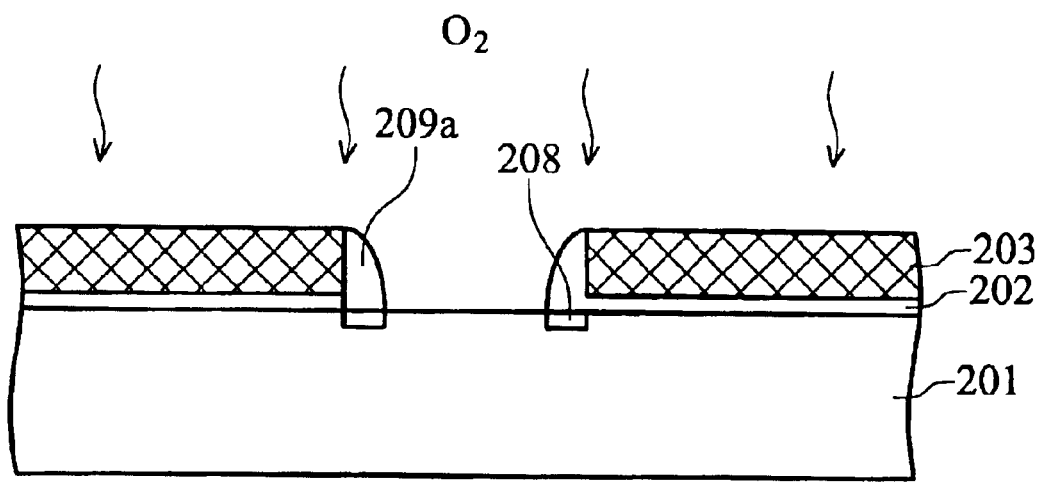

In FIG. 2g, the insulating layer 209 is anisotropic etched to form a second spacer 209a on the sidewall of the opening 206. The anisotropic etching comprises reactive ion etching and plasma etching.

Figure 2H:
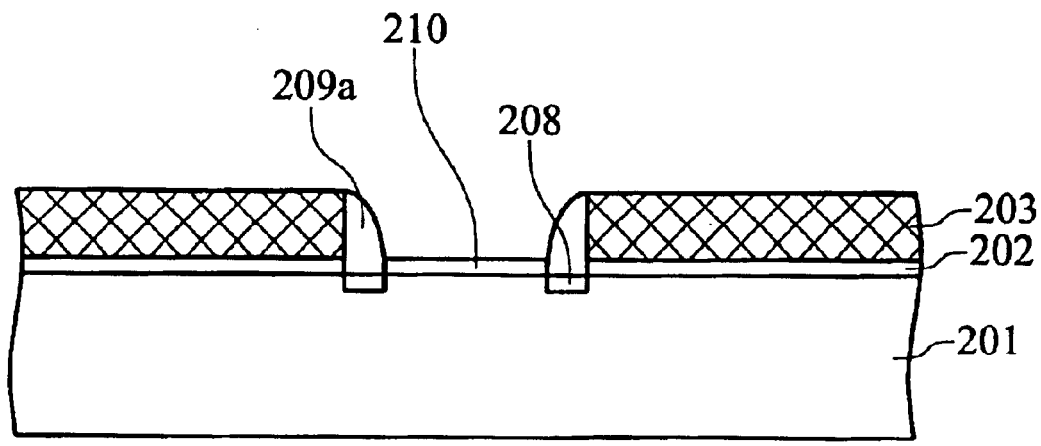

In FIG. 2h, the semiconductor substrate 201 is thermally oxidized to form a gate dielectric layer 210, such as a gate oxide layer, on the exposed semiconductor substrate 201 through the opening 206.

Figure 2I:
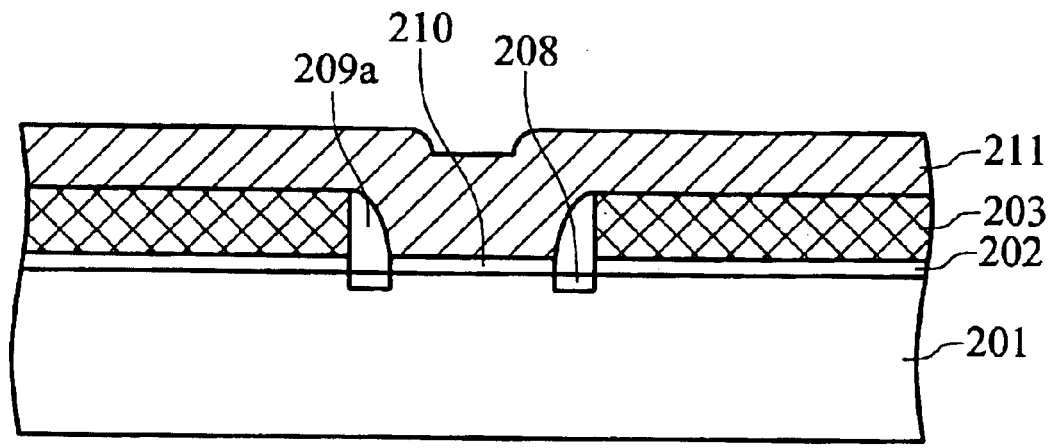

In FIG. 2i, a conducting layer 211, such as N type poly layer or an N type epitaxial silicon, is formed on the hard mask layer 203, and the opening 206 is filled with the conducting layer 211.

Figure 2J:
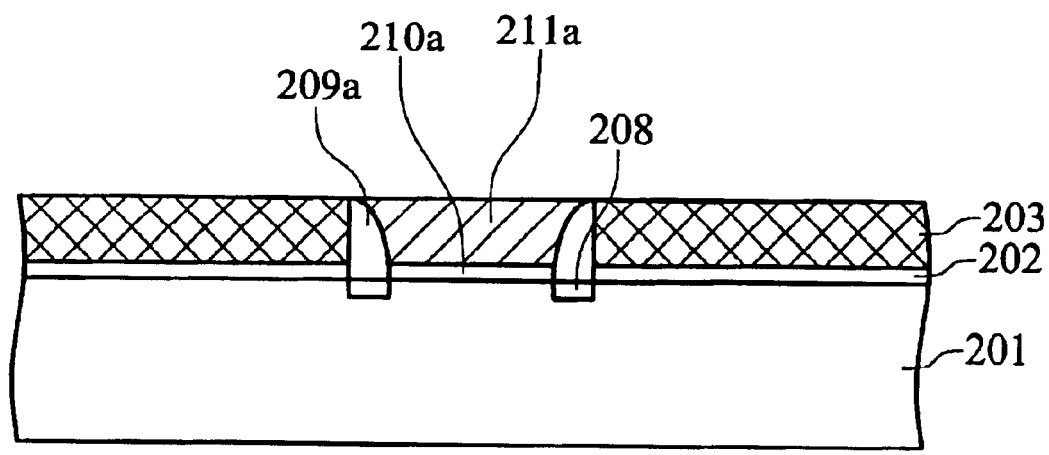
Figure 2K:
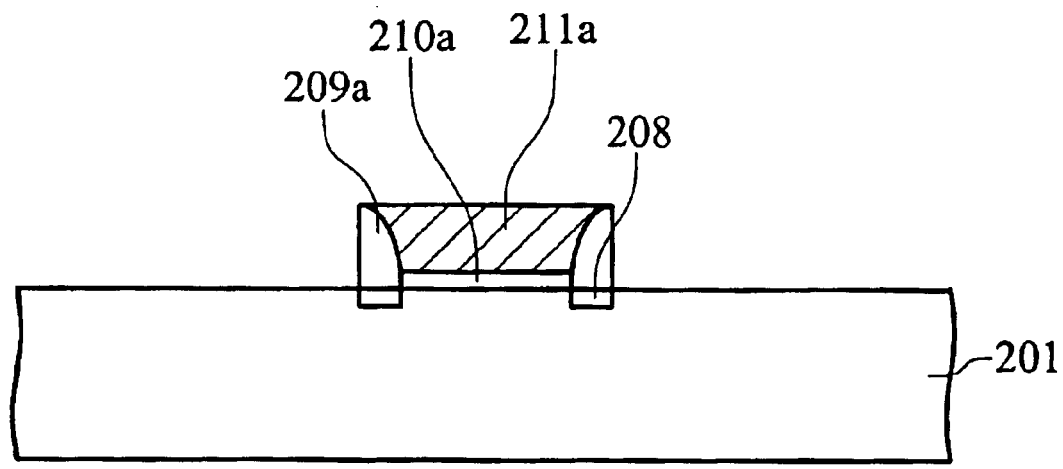

In FIG. 2j, the conducting layer 211 is chemical mechanical polished until the hard mask layer 203 is exposed, and the hard mask layer 203 and the dielectric layer 202 are sequentially removed to leave the conducting layer 210a in the opening 206, wherein the conducting layer 210a is the T-shaped gate 210a as showed in FIG. 2k.

Figure 2L:
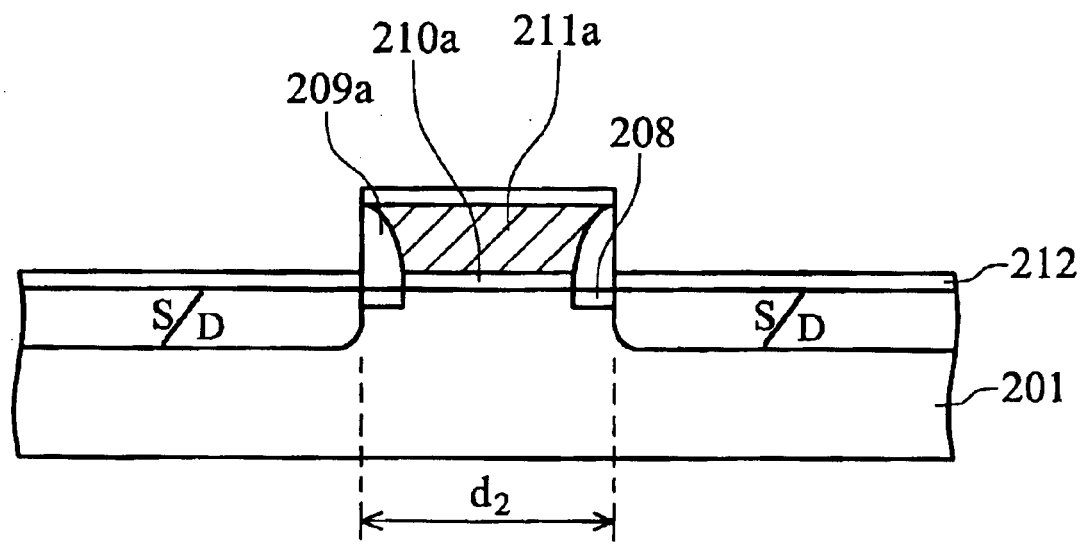

In FIG. 2l, ions are implanted into the semiconductor substrate 201 to form a source/drain(S/D) area therein using the T-shaped gate 210a and the second spacer 209a as masks, and the S/D area connects to the lightly doped area 208. A salicide layer 212 is formed on the T-shaped gate 210a and the S/D area, and the PMOS with T-shaped gate is thus complete.

Embodiment 2

Figure 3A:
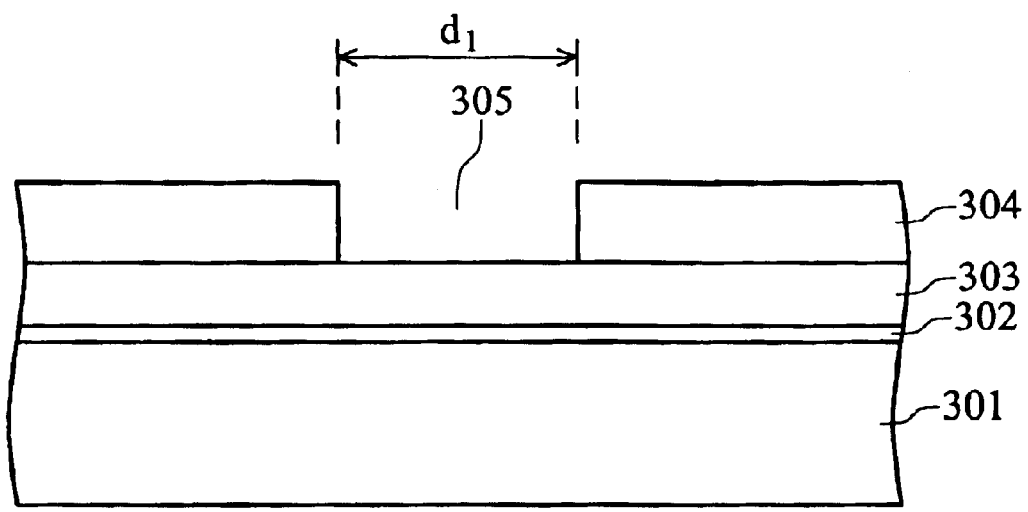
FIGS. 3a to 3j are cross sections of the method for forming a memory unit with a T-shaped gate of Embodiment 2 of the present invention.

In FIG. 3a, a semiconductor substrate 301, such as Si substrate, is provided. A dielectric layer 302, such as a pad oxide layer, a hard mask layer 303, such as a LPCVD nitride layer, and a patterned resist layer 304 with an opening 305 are sequentially formed over the semiconductor substrate 301, and the opening 305 exposes the surface of the hard mask layer 303.

Figure 3B:
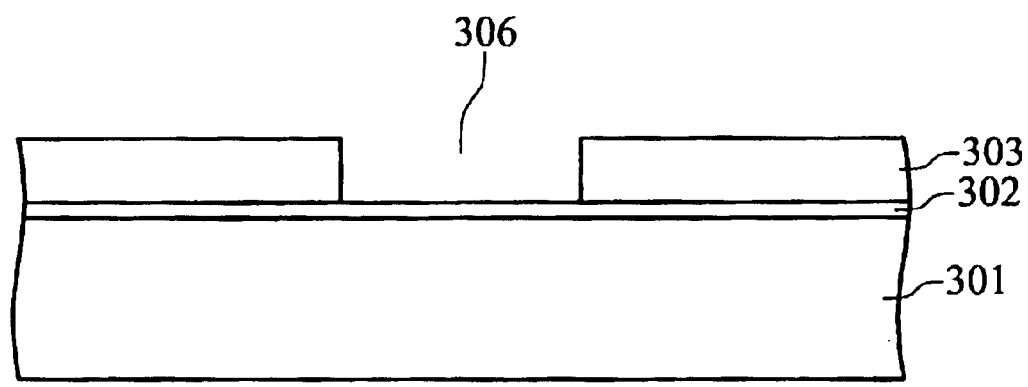

In FIG. 3b, the hard mask layer 303 is etched to form an opening 306 using the patterned resist layer 304 as a mask. The opening 306 in the hard mask layer 303 exposes the surface of the dielectric layer 302.

Figure 3C:
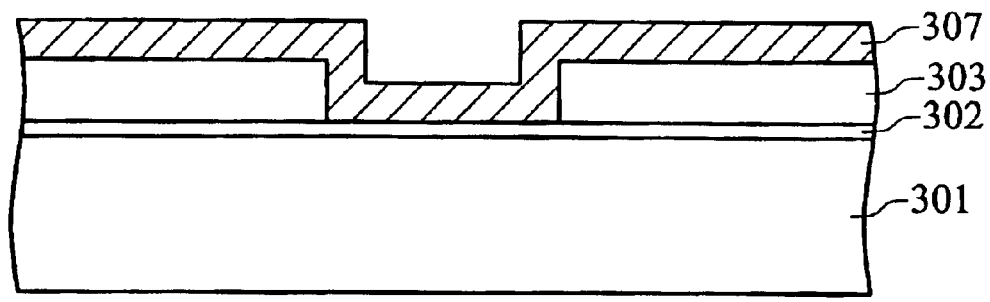

In FIG. 3c, a first conducting layer 307 is conformally formed over the hard mask layer 303 and the opening 306. The forming method of the first insulating layer 307 can be chemical vapor deposition. The first conducting layer 307 can be an N type poly layer or an N type epitaxial silicon layer.

Figure 3D:
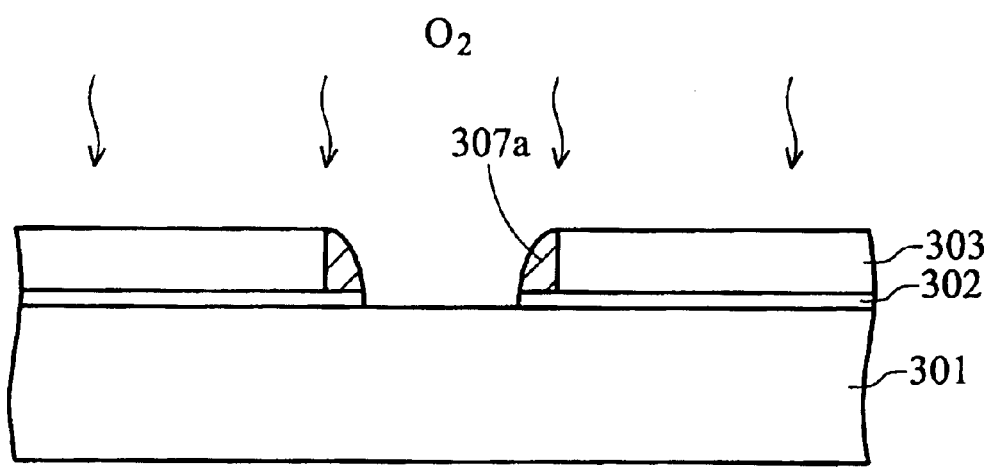

In FIG. 3d, the first conducting layer 307 is anisotropic etched to form a first spacer 307a on a sidewall of the opening 306, and the exposed dielectric layer 302 through the opening 306 is removed. The anisotropic etching comprises reactive ion etching and plasma etching.

Figure 3E:
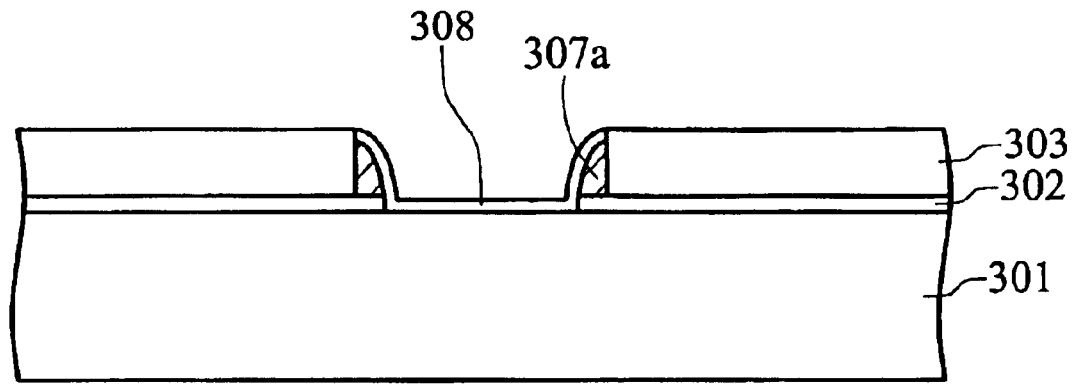

In FIG. 3e, the first spacer 307a is thermally oxidized to form a first gate dielectric layer 308, such as a gate oxide layer, on the surface of the exposed semiconductor substrate 301 in the opening 306 and the first spacer 307a.

Figure 3F:
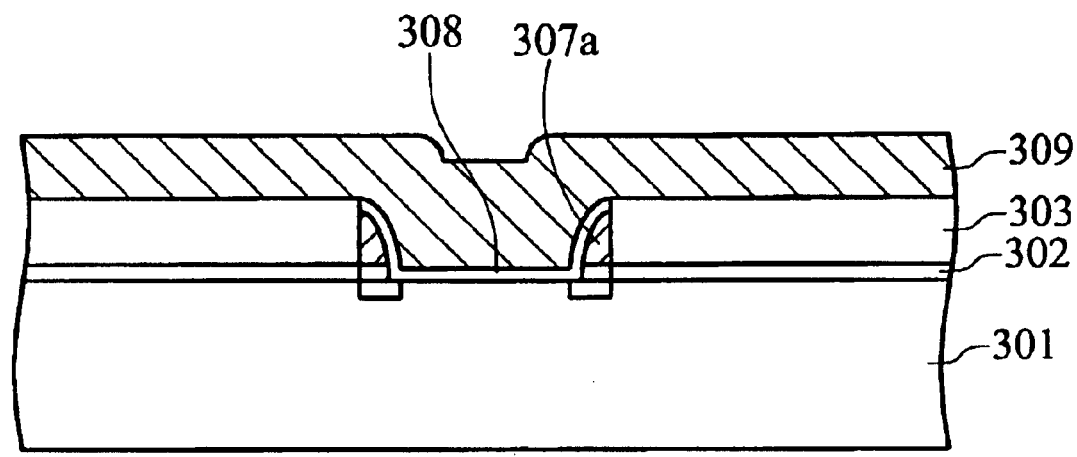

In FIG. 3f, a second conducting layer 309 is formed over the hard mask layer 303, and the opening 306 is filled with the second conducting layer 309. The second conducting layer 309 can be a P type poly layer or a P type epitaxial silicon layer, and the electrical characteristics of the second conducting layer 309 different from the first conducting layer 307.

Figure 3G:
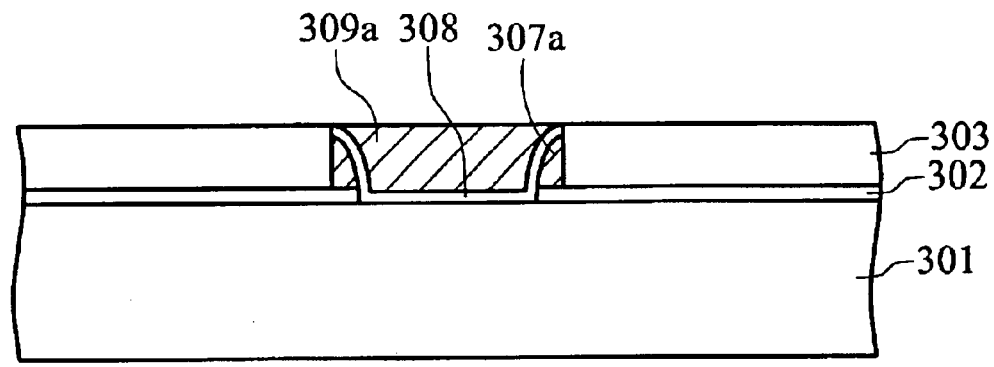

In FIG. 3g, the second conducting layer 309 is chemical mechanical polished until the hard mask layer 303 is exposed.

Figure 3H:
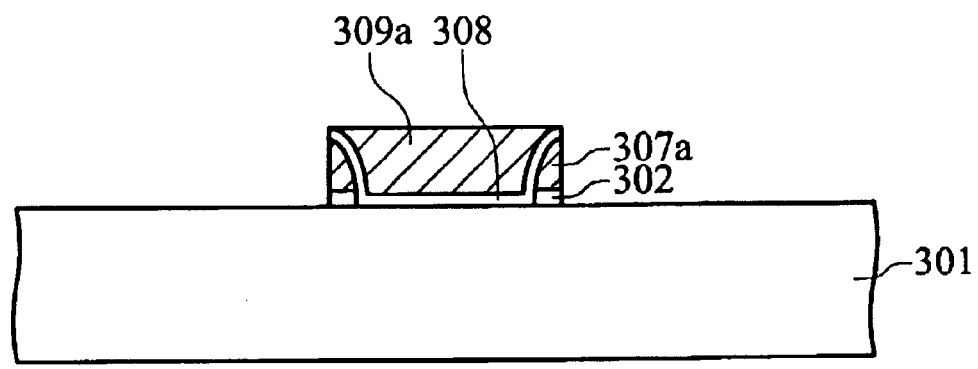

In FIG. 3h, the hard mask layer 303 and the dielectric layer 302 are sequentially removed to leave the second conducting layer 309a filling in the opening 306, wherein the second conducting layer 309a is the T-shaped gate 309a, and an e-channel is automatically formed in the first spacer 307a by coupling effect.

Figure 3I:
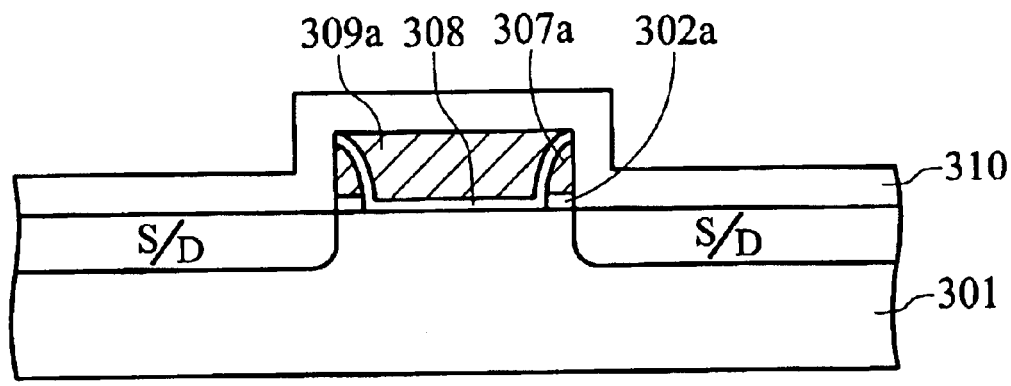

In FIG. 3i, ions are implanted into the semiconductor substrate 301 to form a source/drain(S/D) area in the semiconductor substrate 301 using the T-shaped gate 309a and the first spacer 307a as masks, and the S/D area connects to the first spacer 307a. An insulating layer 310, such as an oxide layer, is conformally formed over the semiconductor substrate 301, the T-shaped gate 309a, and the first spacer 307a.

Figure 3J:
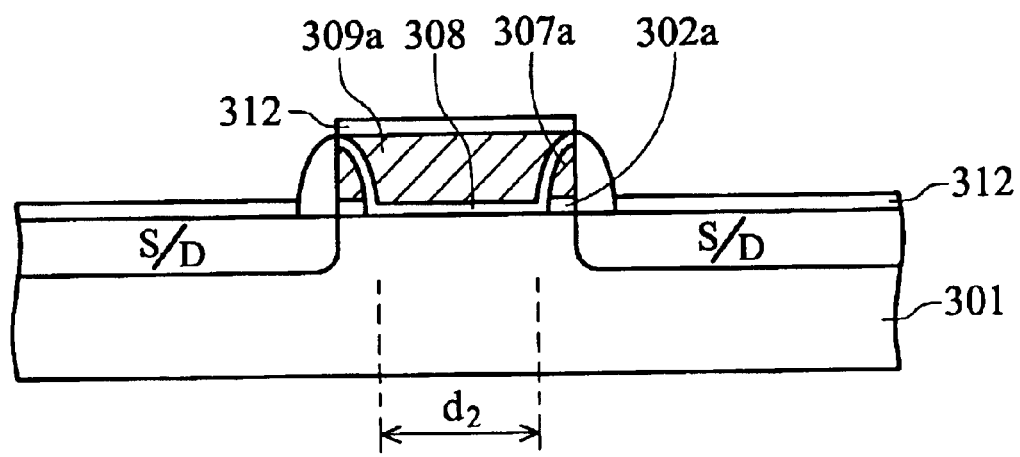

In FIG. 3j, the insulating layer 310 is anisotropic etched to form a second spacer 310a on a sidewall of the first spacer 307a, wherein the second spacer 310a prevents the first spacer 307a from oxidizing or metalizing. A salicide layer 312 is formed on the T-shaped gate 309a and the S/D area, therefore an NMOS with T-shaped gate is thus complete.

EXAMPLE 3

In FIG. 4a, a semiconductor substrate 401, such as Si substrate, is provided. A dielectric layer 402, such as a pad oxide layer, a hard mask layer 403, such as a LPCVD nitride layer, and a patterned resist layer 404 with an opening 405a and an opening 405b are sequentially formed over the semiconductor substrate 401, and the openings 405a and 405b expose the surface of the hard mask layer 403.

In FIG. 4b, the hard mask layer 403 is etched to form an opening 406a and an opening 406b using the patterned resist layer 404 as a mask. The openings 406a and 406b in the hard mask layer 403 expose the surface of the dielectric layer 402.

In FIG. 4c, an insulating layer 407 is conformally formed over the hard mask layer 403 and the openings 406a and 406b, and a photoresist layer 408 is formed in the opening 406b. The forming method of the insulating layer 407 can be chemical vapor deposition. The insulating layer 407 can be a silicate glass layer such as borosilicate glass layer.

In FIG. 4d, the insulating layer 407 is anisotropic etched to form a spacer 407a on a sidewall of the opening 406, and the exposed dielectric layer 402 through the opening 406 is removed. The anisotropic etching comprises reactive ion etching and plasma etching.

The photoresist layer 408 formed in the opening 406b is removed, and a photoresist 409 is formed in the opening 406a. The insulating layer 407 and the exposed dielectric layer 402 are removed using the photoresist layer 409 as a mask, and then the photoresist layer 409 is removed.

In FIG. 4e, the spacer 407a is annealed to form a lightly doped area 410 under the first spacer 407a in the semiconductor substrate 401 because the boron ions of the borosilicate glass diffuse to the semiconductor substrate 401. The spacer 407a is removed as show in FIG. 4f. The lightly doped area 410 can be P type lightly doped area such as a boron lightly doped area.

In FIG. 4g, an insulating layer 411 is conformally formed over the hard mask layer 403 and the openings 406a and 406b, and a photoresist layer 412 is formed in the opening 406b. The insulating layer 411 can be a silicate glass layer such as a nitrodilicate glass layer.

In FIG. 4h, the insulating layer 411 is anisotropic etched to form a spacer 411a on the sidewall of the opening 406a. The anisotropic etching comprises reactive ion etching and plasma etching.

In FIG. 4i, the photoresist layer 412 is removed, and a photoresist layer 413 is formed in the opening 406a. The insulating layer 411 is removed using the photoresist layer 413 as a mask.

In FIG. 4j, the semiconductor substrate 401 is thermally oxidized.

In FIG. 4k, after thermal oxidation, a gate dielectric layer 414a and a gate dielectric layer 414b, such as a gate oxide layer, are formed on the exposed semiconductor substrate 401 through the openings 406a and 406b respectively. A conducting layer 415, such as N type poly layer or an N type epitaxial silicon layer is formed over the hard mask layer 403, and the openings 406a and 406b are filled with the conducting layer 415 respectively.

In FIG. 4l, the conducting layer 415 is anisotropic etched to form a spacer 415a on a sidewall of the spacer 411a and a spacer 415b on a sidewall of the spacer 411b respectively, and the exposed gate dielectric layers 414a and 414b are removed. The anisotropic etching comprises reactive ion etching and plasma etching.

In FIG. 4m, the semiconductor substrate 401 is thermally oxidized to form a gate dielectric layer 416a and a gate dielectric layer 416b respectively. The gate dielectric layer 416a and 416b can be gate oxide layer. The gate dielectric layer 416a is formed on the exposed semiconductor substrate 401 in the opening 406a and the spacer 415a, and the gate dielectric layer 416b is formed on the exposed semiconductor substrate 401 in the opening 406b and the spacer 415b. A gate dielectric layer 417a consists of the gate dielectric layer 414a and 416a, and a gate dielectric layer 417b consists of the gate dielectric layer 414b and 416b.

A conducting layer 418, such as P type poly layer or a P type epitaxial silicon layer is formed over the hard mask layer 403, and the openings 406a and 406b are filled with the conducting layer 418 respectively.

In FIG. 4n, the conducting layer 418 is chemical mechanical polished until the hard mask layer 403 is exposed to leave the conducting layer 418a and 418b in the openings 406a and 406b respectively, wherein the conducting layer 418a and 418b are the T-shaped gate of PMOS and NMOS respectively.

In FIG. 4o, the hard mask layer 403 and the exposed dielectric layer 402 are sequentially removed. Ions are implanted into the semiconductor substrate 401 to form source/drain (S/D) area using the T-shaped gates 418a and 418b as masks. An insulating layer 419, such as a LPCVD oxide layer or a PECVD oxide layer, is conformally formed on the semiconductor substrate 401 and the T-shaped gates 418a and 418b.

In FIG. 4p, the insulating layer 419 is anisotropic etched to form a spacer 419a on the sidewall of the spacer 411a and a spacer 419b on the sidewall of the spacer 415b, wherein the spacer 419b prevents the spacer 415b from oxidizing or metaling. A salicide layer 420 is formed on the T-shaped gate 418a and 418b and the S/D area, a CMOS with T-shaped gate is thus complete. The anisotropic etching comprises reactive ion etching and plasma etching.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a memory unit with T-shaped gate for a PMOS, comprising:
    providing a semiconductor substrate, with a dielectric layer and a patterned hard mask layer with an opening are formed thereon, wherein the opening exposes the dielectric layer;
    forming a doped spacer on a sidewall of the opening;
    annealing the doped spacer to form a lightly doped area in the semiconductor substrate;
    removing the doped spacer and the dielectric in the opening;
    forming an insulating spacer on the sidewall of the opening;
    forming a gate dielectric layer on the surface of the opening and the semiconductor substrate and a conducting layer in the opening;
    removing the patterned hard mask layer; and
    forming an ion doped area on a side of the lightly doped area in the semiconductor substrate.

2. The method for fabricating a memory unit with T-shaped gate as claimed in claim 1, wherein the dielectric layer comprises a pad oxide layer.

3. The method for fabricating a memory unit with T-shaped gate as claimed in claim 1, wherein the patterned hard mask layer comprises a nitride layer.

4. The method for fabricating a memory unit with T-shaped gate as claimed in claim 1, wherein the doped spacer comprises a doped silicate glass spacer.

5. The method for fabricating a memory unit with T-shaped gate as claimed in claim 4, wherein the doped silicate glass spacer comprises a borosilicate glass spacer.

6. The method for fabricating a memory unit with T-shaped gate as claimed in claim 5, wherein the lightly doped area comprises a boron ion lightly doped area.

7. The method for fabricating a memory unit with T-shaped gate as claimed in claim 1, wherein the insulating spacer comprises an oxide spacer.

8. The method for fabricating a memory unit with T-shaped gate as claimed in claim 1, wherein the gate dielectric layer comprises a gate oxide layer.

9. The method for fabricating a memory unit with T-shaped gate as claimed in claim 1, wherein the conducting layer comprises an N type poly layer and an N type epitaxial silicon layer.

10. The method for fabricating a memory unit with T-shaped gate as claimed in claim 1, wherein the ion doped area comprises an N type ion doped area.

11. The method for fabricating a memory unit with T-shaped gate as claimed in claim 5, wherein the ion doped area comprises a boron ion doped area.

12. A method for fabricating a memory unit with T-shaped gate for a CMOS, comprising:

providing a semiconductor substrate, with a dielectric layer and a patterned hard mask layer with a first opening and a second opening formed thereon, wherein the first opening and the second opening expose the dielectric layer;

forming a silicate glass spacer on a sidewall of the first opening;

removing the exposed dielectric layer in the first opening and the second opening sequentially;

annealing the silicate glass spacer in the first opening to form a lightly doped area under the silicate glass spacer in the semiconductor substrate;

removing the silicate glass spacer;

forming an insulating spacer on the sidewall of the first opening;

forming a first spacer on a sidewall of the second opening;

forming a first N type conducting spacer and a second N type conducting spacer on the sidewall of the insulating spacer and the first spacer respectively;

forming a first gate dielectric layer on the surface of the first opening of the semiconductor substrate and the first N type conducting spacer;

forming a second gate dielectric layer on the surface of the second opening of the semiconductor substrate and the second N type conducting spacer;

forming a first P type conducting layer and a second P type conducting layer in the first opening and the second opening respectively;

removing the patterned hard mask layer; and forming a second spacer on the sidewall of the second N type conducting spacer.

13. The method for fabricating a memory unit with T-shaped gate as claimed in claim 12, wherein the dielectric layer comprises a pad oxide layer.

14. The method for fabricating a memory unit with T-shaped gate as claimed in claim 12, wherein the patterned hard mask layer comprises a nitride layer.

15. The method for fabricating a memory unit with T-shaped gate as claimed in claim 12, wherein the doped silicate glass spacer comprises a borosilicate glass spacer.

16. The method for fabricating a memory unit with T-shaped gate as claimed in claim 12, wherein the lightly doped area comprises a boron lightly doped area.

17. The method for fabricating a memory unit with T-shaped gate as claimed in claim 12, wherein the first spacer comprises an oxide spacer.

18. The method for fabricating a memory unit with T-shaped gate as claimed in claim 12, wherein the first N type conducting spacer comprises an N type poly spacer or an N type epitaxial silicon spacer.

19. The method for fabricating a memory unit with T-shaped gate as claimed in claim 12, wherein the second N type conducting spacer comprises an N type poly spacer or an N type epitaxial silicon spacer.

20. The method for fabricating a memory unit with T-shaped gate as claimed in claim 12, wherein the first gate dielectric layer comprises a gate oxide layer.

21. The method for fabricating a memory unit with T-shaped gate as claimed in claim 12, wherein the second gate dielectric layer comprises a gate oxide layer.

22. The method for fabricating a memory unit with T-shaped gate as claimed in claim 12, wherein the first P type conducting spacer comprises a P type poly spacer or a P type epitaxial silicon spacer.

23. The method for fabricating a memory unit with T-shaped gate as claimed in claim 12, wherein the second P type conducting spacer comprises a P type poly spacer or an N type epitaxial silicon spacer.

24. The method for fabricating a memory unit with T-shaped gate as claimed in claim 12, wherein the second spacer comprises an oxide spacer.

* * * * *